(12) United States Patent
Ojalvo et al.

(10) Patent No.: US 10,073,634 B2
(45) Date of Patent: Sep. 11, 2018

(54) RECOVERY FROM PROGRAMMING FAILURE IN NON-VOLATILE MEMORY

(71) Applicant: Apple Inc., Cupertino, CA (US)

(72) Inventors: Shai Ojalvo, Moshav Olesh (IL); Eyal Gurgi, Petah-Tikva (IL); Yoav Kasorla, Kfar Netar (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/821,008

(22) Filed: Aug. 7, 2015

(65) Prior Publication Data

US 2015/0355858 A1 Dec. 10, 2015

Related U.S. Application Data

(63) Continuation of application No. 14/048,492, filed on Oct. 8, 2013, now Pat. No. 9,135,113.

(51) Int. Cl.
| | |
|---|---|
| *G06F 11/00* | (2006.01) |
| *G06F 11/10* | (2006.01) |
| *G06F 3/06* | (2006.01) |
| *G11C 29/52* | (2006.01) |

(52) U.S. Cl.
CPC ............ *G06F 3/0619* (2013.01); *G06F 3/064* (2013.01); *G06F 3/0659* (2013.01); *G06F 3/0683* (2013.01); *G06F 11/1012* (2013.01); *G06F 11/1044* (2013.01); *G06F 11/1068* (2013.01); *G06F 11/1076* (2013.01); *G11C 29/52* (2013.01); *G06F 11/008* (2013.01)

(58) Field of Classification Search
CPC ...... G06F 3/0619; G06F 3/064; G06F 3/0659; G06F 3/0683; G06F 11/1012; G06F 11/1076; G06F 11/1044; G06F 11/1068; G06F 11/008; G11C 29/52

USPC ........................................................ 714/764
See application file for complete search history.

(56) References Cited

U.S. PATENT DOCUMENTS

| | | | |
|---|---|---|---|
| 7,594,157 B2 * | 9/2009 | Choi ................... | G11C 11/5628 365/185.09 |
| 7,873,782 B2 | 1/2011 | Terry et al. | |
| 7,924,628 B2 | 4/2011 | Danon et al. | |
| 7,945,825 B2 | 5/2011 | Cohen et al. | |

(Continued)

OTHER PUBLICATIONS

Sai Krishna Mylavarapu et al; "FSAF: File System Aware Flash Translation Layer for NAND Flash Memories"; Design, Automation & Test in Europe Conference & Exhibition; Apr. 2009; pp. 399-404; IEEE; United States.

*Primary Examiner* — Demetrios C Kerveros
(74) *Attorney, Agent, or Firm* — Meyertons, Hood, Kivlin, Kowert & Goetzel, P.C.

(57) ABSTRACT

A method includes storing data encoded with an Error Correction Code (ECC) in analog memory cells, by buffering the data in a volatile buffer and then writing the buffered data to the analog memory cells while overwriting at least some of the data in the volatile buffer with success indications. Upon detecting a failure in writing the buffered data to the analog memory cells, recovered data is produced by reading both the volatile buffer and the analog memory cells, assigning reliability metrics to respective bits of the recovered data depending on whether the bits were read from the volatile buffer or from the analog memory cells, and applying ECC decoding to the recovered data using the reliability metrics. The recovered data is re-programmed.

20 Claims, 3 Drawing Sheets

(56) References Cited

U.S. PATENT DOCUMENTS

| | | |
|---|---|---|
| 8,078,940 B2 | 12/2011 | Uchikawa et al. |
| 8,200,904 B2 | 6/2012 | Lasser |
| 8,228,728 B1 | 7/2012 | Yang et al. |
| 8,281,227 B2 | 10/2012 | Thatcher et al. |
| 8,341,500 B2* | 12/2012 | Byom ................. G06F 11/1072 |
| | | 365/185.33 |
| 8,392,662 B2 | 3/2013 | Jang et al. |
| 8,407,563 B2 | 3/2013 | Karabed et al. |
| 8,429,501 B2 | 4/2013 | Tseng et al. |
| 8,549,380 B2 | 10/2013 | Motwani |
| 8,595,573 B2 | 11/2013 | Shalvi et al. |
| 8,694,854 B1 | 4/2014 | Dar et al. |
| 8,750,050 B2 | 6/2014 | Kamano et al. |
| 8,856,621 B2 | 10/2014 | Eun et al. |
| 8,869,004 B2 | 10/2014 | Chao |
| 8,874,994 B2 | 10/2014 | Sharon et al. |
| 2007/0300130 A1* | 12/2007 | Gorobets ............ G06F 11/1068 |
| | | 714/766 |
| 2009/0049364 A1* | 2/2009 | Jo ....................... G06F 11/1072 |
| | | 714/763 |
| 2011/0072188 A1 | 3/2011 | Oh et al. |
| 2011/0252289 A1 | 10/2011 | Patapoutian et al. |
| 2012/0124450 A1* | 5/2012 | Yang ................... G06F 11/1012 |
| | | 714/773 |
| 2012/0260149 A1* | 10/2012 | Chang ................. G06F 11/1068 |
| | | 714/773 |
| 2013/0042054 A1 | 2/2013 | Jung et al. |
| 2013/0159815 A1* | 6/2013 | Jung ..................... G06F 11/10 |
| | | 714/773 |
| 2014/0059406 A1* | 2/2014 | Hyun ................. G11C 11/5621 |
| | | 714/773 |

* cited by examiner

RECOVERY FROM PROGRAMMING FAILURE IN NON-VOLATILE MEMORY

PRIORITY INFORMATION

This application claims priority to, and is a continuation of, U.S. provisional patent application Ser. No. 14/048,492, entitled "RECOVERY FROM PROGRAMMING FAILURE IN NON-VOLATILE MEMORY," filed Oct. 8, 2013, which is hereby incorporated by reference in its entirety as though fully and completely set forth herein.

TECHNICAL FIELD

The present disclosure relates generally to data storage, and particularly to methods and systems for programming non-volatile memory.

BACKGROUND

When writing data to a non-volatile memory, the data is typically first cached in a buffer and is then programmed to analog memory cells of the memory. Occasionally, a programming operation may fail and re-programming of the original data is required. Various methods for data re-programming following a programming failure are known in the art. For example, U.S. Pat. No. 7,945,825, whose disclosure is incorporated herein by reference, describes methods and circuits for performing recovery associated with programming of non-volatile memory (NVM) array cells. According to embodiments, there are provided methods and circuits for programming NVM cells, including: (1) erasing NVM array cells; (2) loading an SRAM with user data; (3) if programming is successful, then flipping bits in the SRAM; and (4) if programming is not successful, reading data back from the array to the SRAM.

U.S. Pat. No. 7,924,628, whose disclosure is incorporated herein by reference, describes a cache programming operation which requires two SRAMs (one for the user and one for the array) that may be combined with a multi-level cell (MLC) programming operation which also requires two SRAMs (one for caching the data and one for verifying the data), using only a total of two SRAMs (or buffers). One of the buffers (User SRAM) receives and stores user data. The other of the two buffers (Cache SRAM) may perform a caching function as well as a verify function. In this manner, if a program operation fails, the user can have its original data back so that he can try to reprogram it to a different place (address).

SUMMARY OF THE EMBODIMENTS

An embodiment provides a method including storing data encoded with an Error Correction Code (ECC) in analog memory cells, by buffering the data in a volatile buffer and then writing the buffered data to the analog memory cells while overwriting at least some of the data in the volatile buffer with success indications. Upon detecting a failure in writing the buffered data to the analog memory cells, recovered data is produced by reading both the volatile buffer and the analog memory cells, assigning reliability metrics to respective bits of the recovered data depending on whether the bits were read from the volatile buffer or from the analog memory cells, and applying ECC decoding to the recovered data using the reliability metrics. The recovered data is re-programmed.

In some embodiments, producing the recovered data includes setting a given bit in the recovered data to a corresponding bit value read from the analog memory cells if the corresponding bit value read from the volatile buffer is a success indication, and setting the given bit in the recovered data to the corresponding bit value read from the volatile buffer if the corresponding bit value read from the volatile buffer differs from the success indication.

In other embodiments, assigning the reliability metrics includes assigning to the bits that were read from the analog memory cells lower reliability metrics relative to the reliability metrics assigned to the bits that were read from the volatile buffer. In yet other embodiments, the data includes a portion of storage data received from a host, and the method includes discarding the data after buffering the data in a volatile buffer, irrespective of whether a remaining portion of the storage data is stored in the analog memory cells.

In an embodiment, the analog memory cells are included in a memory device, and reading the volatile buffer and the analog memory cells is performed by circuitry internal to the memory device, and applying the ECC decoding is performed by a memory controller that controls the memory device.

In another embodiment, reading the analog memory cells includes reading the bits from the analog memory cells using one or more dedicated read thresholds, which are dedicated for recovery from programming failures and differ from normal read thresholds used for data readout. In yet another embodiment, re-programming the recovered data includes writing the recovered data to a group of the analog memory cells other than the analog memory cells in which the failure has occurred. In yet another embodiment, producing the recovered data includes writing the recovered data in-place in the volatile buffer.

There is additionally provided, in accordance with an embodiment, apparatus including a memory, which includes multiple analog memory cells, and storage circuitry. The storage circuitry is configured to store data encoded with an Error Correction Code (ECC) in the analog memory cells by buffering the data in a volatile buffer and then writing the buffered data to the analog memory cells while overwriting at least some of the data in the volatile buffer with success indications, and is further configured to produce recovered data upon detecting a failure in writing the buffered data to the analog memory cells, by reading both the volatile buffer and the analog memory cells, assigning reliability metrics to respective bits of the recovered data depending on whether the bits were read from the volatile buffer or from the analog memory cells, and applying ECC decoding to the recovered data using the reliability metrics, and to re-program the recovered data.

The embodiments disclosed herein will be more fully understood from the following detailed description, taken together with the drawings in which:

DETAILED DESCRIPTION OF EMBODIMENTS

Overview

Figure 1:
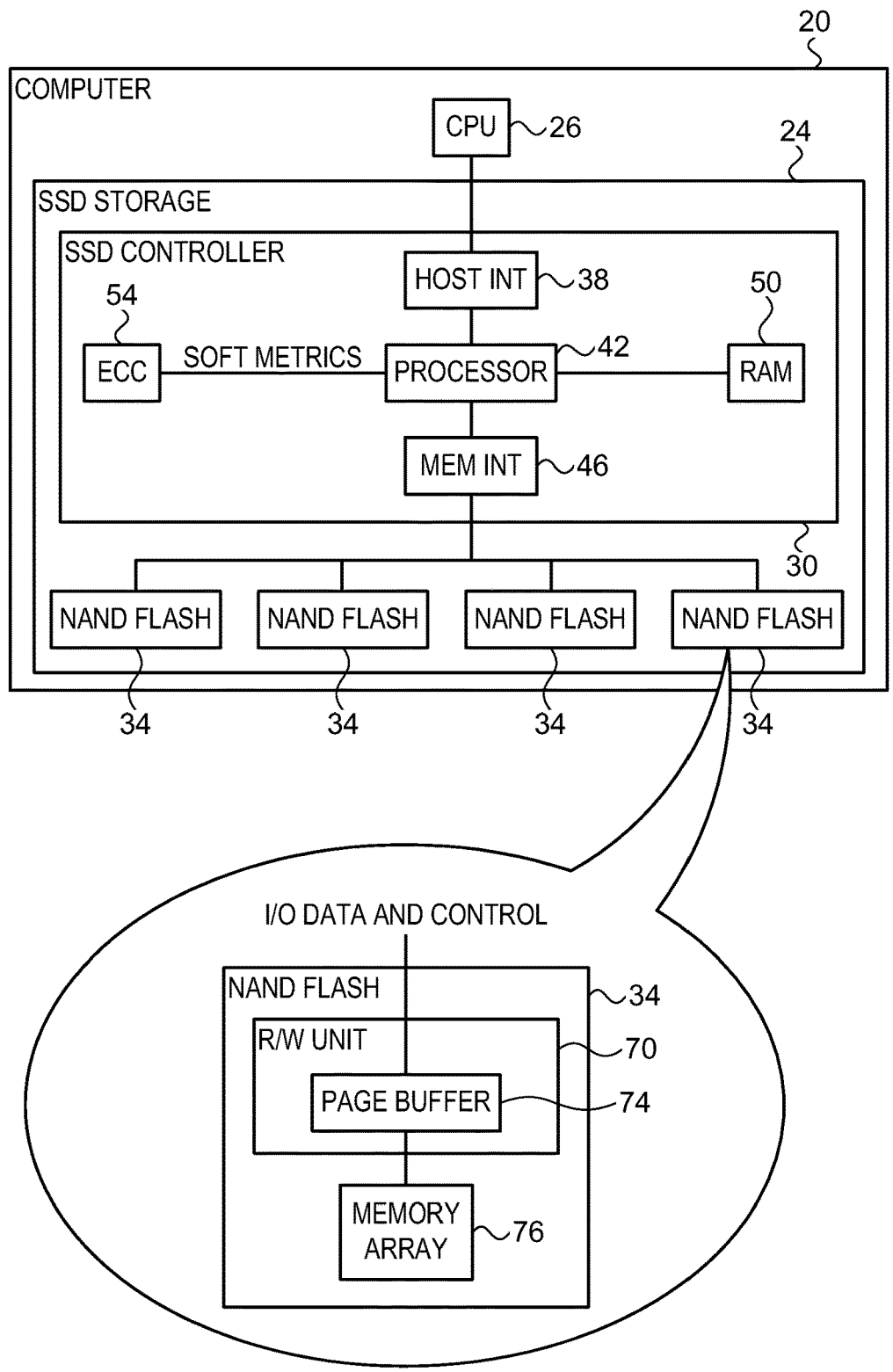
FIG. 1 is a block diagram that schematically illustrates a memory system, in accordance with an embodiment.

A storage device such as a Solid State Drive (SSD) typically comprises an SSD controller and one or more non-volatile memory devices (such as NAND Flash memory devices). In some systems, the SSD controller accepts data for storage from a host computer and stores at least part of the data in a volatile buffer of the Flash device, which then writes or programs the buffered data to analog memory cells of the Flash device. Occasionally, the programming operation fails, and the original buffered data needs to be recovered and re-programmed.

Embodiments that are described herein provide improved methods and systems for recovery from programming failure in a non-volatile memory. The disclosed methods may be implemented in the SSD controller, in each of the non-volatile devices, in the host, or jointly by two or more of these elements.

In an example embodiment, the non-volatile memory device comprises at least one buffer, referred to herein as a page buffer, which stores data to be programmed. As will be described below, the disclosed methods enable data recovery from programming failure, using both the page buffer and the non-volatile memory. The disclosed techniques do not rely on the availability of the original data in the SSD controller and/or the host.

The page buffer stores data in units which are referred to as data pages. In some embodiments, programming is performed by applying programming pulses that cause the memory cells to reach certain programming levels (e.g., cell threshold voltages). Typically, some of the programmed cells reach the desired programming level after applying fewer programming pulses than others, and are thus inhibited from receiving further programming pulses.

While programming a data page, the data written in locations of the page buffer that correspond to analog memory cells already successfully programmed, is replaced with success indications. In some embodiments, the success indication is equal to the data bits of an erasure programming level. Following successful programming of the data page, all the locations of the respective page buffer are set to the success indication value.

When programming failure occurs, cells corresponding to page buffer locations in which the success indication is written are identified as successfully programmed cells, whereas cells that correspond to locations that are written with data other than the success indication are identified as cells whose programming has failed. Note that when programming failure occurs, part of original data may still be stored in locations of the page buffer that are not yet programmed, whereas at least some of the original data is replaced with success indications and is therefore lost.

To recover from programming failure, the original page data should be reliably recovered. In an embodiment, the original data is reconstructed by combining the data bits in the page buffer with the corresponding data bits in the non-volatile memory. The resulting recovered page is referred to herein as a combined data page. For bits whose programming has failed, the respective bits in the page buffer still hold the original bit values, and therefore these bit values in the combined data page are taken from the page buffer. For bits whose programming succeeded, the respective bits in the page buffer are overwritten with success indications, but the non-volatile memory cells hold the correct bit values. Therefore, these bit values in the combined data page are taken from the non-volatile memory.

In the disclosed embodiments, bit values in the combined page that are taken from the non-volatile memory are assigned reliability metrics that indicate reduced reliability, because readout from analog memory cells has some non-zero error probability. Bit values taken from the non-volatile memory cells, on the other hand, are assumed to be error-free and are therefore assigned reliability metrics that indicate high reliability. In the description that follows we use the terms "high reliability metric" and "reduced reliability metric" to describe metrics that indicate a high or reduced reliability level, respectively. The reconstructed (i.e., combined) data page is then subjected to ECC decoding, using both the high and reduced reliability metrics, before the page is re-programmed. In some embodiments, the ECC decoding operation employs hard rather than soft decoding. Applying hard or soft decoding may depend, for example, on the age of the memory device (or individual block) relative to its expected total lifetime.

In some systems, a host computer stores data in the SSD using host commands that are referred to as TAGs. The size of the data delivered in a TAG command is typically much larger than the data size that can be programmed to a non-volatile memory in a single programming command. Each TAG is assigned a descriptor, which is referred to as an ETAG. An ETAG comprises pointers to the TAG data and dynamic information regarding the progress of the TAG command.

In principle, the TAG data to be programmed in the non-volatile memory and the respective ETAG can be cached locally, e.g., in a volatile memory of the SSD controller (and/or in a memory of the host) until all the data is successfully programmed, so that in case of a programming failure the original data can be recovered and re-programmed. The size of the TAG data, however, can be on the order of 1 MB, and therefore accepting new TAG might be delayed until all data of former TAGs is successfully programmed. Another difficulty with this caching approach is that a most significant bit (MSB) data page and the respective least significant bit (LSB) data page (that is first programmed to the same group of cells) may relate to different TAG commands. In such cases, when failure occurs during the programming of a MSB data page, the data of the respective LSB data page (which is required for MSB page programming) may not be available.

Yet another problem with the above-mentioned approach is related to managing the ETAGs by the SSD controller. As explained above, ETAGs maintain pointers to the original data and therefore should be stored until programming succeeds. Since the SSD controller has limited memory and computation resources, the number of ETAGs that the SSD controller can manage simultaneously is also limited. For example, in an example embodiment, the SSD controller may allocate a single ETAG descriptor per non-volatile memory device. As a result, the need to save ETAGs until successful programming is acknowledged, limits the number of concurrent TAGs that the SSD controller can handle.

Using the disclosed techniques, a non-volatile memory device can internally reconstruct the original page data for re-programming, and there is no longer need to cache TAG data and ETAG descriptors. As a result, memory and computation resources can be reduced, or made available for other tasks of the SSD controller. Moreover, since the disclosed techniques eliminate the delay created by the need to wait for the acknowledgement of successful programming of large amounts of data (i.e., Tag data), the number of concurrent host commands that the SSD controller can handle increases significantly. Additionally, the use of reliability metrics for ECC decoding improves the reliability of the data recovered for re-programming.

System Description

FIG. 1 is a block diagram that schematically illustrates a memory system, in accordance with an embodiment. In the present example, the memory system comprises a computer 20 that stores data in a Solid state Drive (SSD) 24. Computer 20 may comprise, for example, a mobile, tablet or personal computer. The computer comprises a Central Processing Unit (CPU) 26 that serves as a host. In the description that follows, the terms CPU and host are used interchangeably.

In alternative embodiments, the host may comprise any other suitable processor or controller, and the storage device may comprise any other suitable device. For example, the host may comprise a storage controller of an enterprise storage system, and the storage device may comprise an SSD or an array of SSDs. Other examples of hosts that store data in non-volatile storage devices comprise mobile phones, digital cameras, media players and removable memory cards or devices.

SSD 24 stores data for CPU 26 in a non-volatile memory, in the present example in one or more NAND Flash memory devices 34. In alternative embodiments, the non-volatile memory in SSD 24 may comprise any other suitable type of non-volatile memory, such as, for example, NOR Flash, Charge Trap Flash (CTF), Phase Change RAM (PRAM), Magnetoresistive RAM (MRAM) or Ferroelectric RAM (FeRAM).

An SSD controller 30 performs the various storage and management tasks of the SSD. The SSD controller is also referred to generally as a memory controller. SSD controller 30 comprises a host interface 38 for communicating with CPU 26, a memory interface 46 for communicating with Flash devices 34, and a processor 42 that carries out the various processing tasks of the SSD.

SSD 24 further comprises a volatile memory, in the present example a Random Access Memory (RAM) 50. In the embodiment of FIG. 1, RAM 50 is shown as part of SSD controller 30, although the RAM may alternatively be separate from the SSD controller. RAM 50 may comprise, for example, a Static RAM (SRAM), a Dynamic RAM (DRAM), a combination of the two RAM types, or any other suitable type of volatile memory. RAM 50 may store data received from host 26 and not yet delivered for storage in Flash devices 34. When programming failure occurs, processor 42 may use RAM 50 to recover the original data to be re-programmed.

In some embodiments, SSD controller 30 comprises an Error Correction Code (ECC) unit 54, which encodes the data for storage using a suitable ECC and decodes the ECC of data retrieved from the memory. Any suitable type of ECC, such as, for example, Low Density Parity Check (LDPC), Reed-Solomon (RS) or Bose-Chaudhuri-Hocquenghem (BCH), can be used. In some embodiments, data bits retrieved from Flash device 34 and delivered for decoding by ECC unit 54 are additionally assigned reliability metrics. For example, the reliability of retrieved data bits may be based on the reliability of the memory from which the data bits are read as explained below.

The bottom part of FIG. 1 depicts an exemplary detailed block diagram of NAND Flash device 34. In the present example, device 34 comprises a reading/writing (R/W) unit 70, which converts data for storage in the memory device to storage values and writes them into analog memory cells of a Flash memory array 76. In alternative embodiments, the R/W unit does not perform the conversion, but is provided with voltage samples, i.e., with the storage values for storage in the cells. In the present example, R/W unit 70 accepts data for storage from SSD controller 30 via memory interface 46 and stores the data to a volatile (e.g., RAM) page buffer 74 prior to programming the data to the memory cells. The R/W unit typically (although not necessarily) programs the cells using an iterative Program and Verify (P&V) process, as is known in the art. When reading data out of array 76, R/W unit 70 converts the storage values of the memory cells into digital samples having a resolution of one or more bits. Data is typically written to and read from the memory cells in groups that are referred to as pages. In some embodiments, the R/W unit can erase a group of cells in memory array 76, e.g., a block comprising multiple pages, by applying one or more negative erasure pulses to the cells.

Memory array 76 may comprise a Single-Level Cell (SLC) memory array that stores 1 bit/cell using two programming levels, or a Multi-Level Cell (MLC) memory array that stores N bits/cell in $2^N$ programming levels. For example, a 2 bits/cell device uses four programming levels, and a 3 bits/cell device uses eight programming levels.

In some embodiments, in order to program data to a group of multi-bit cells, the data is organized in separate data pages, each corresponding to a respective significance bit. In some embodiments, R/W unit 70 programs a least significant bit (LSB) data page to a selected group of cells in the memory array, and later the R/W unit programs a most significant bit (MSB) data page to the same group of cells. In some embodiments, prior to programming the MSB page, the LSB page data is read from the respective group of cells and used for determining the appropriate programming levels.

In a disclosed embodiment, when the programming of a certain data page fails, SSD controller 30, R/W unit 70, or both, recover the content of the original data page by retrieving data from both page buffer 74 and memory array 76. Since the storage values in the Flash memory cells of array 76 can only be programmed and read with limited precision and are subject to various kinds of distortion, memory array 76 typically has lower storage reliability than page buffer 74. Therefore, when R/W unit 70 assigns reliability metrics (to be used for decoding by ECC unit 54) to the retrieved data, the R/W unit assigns data bits read out of memory array 76 reliability metrics that indicate lower reliability level compared to the reliability metrics assigned to data bits read out of page buffer 74.

SSD controller 30, and in particular processor 42, may be implemented in hardware. Alternatively, the SSD controller may comprise a microprocessor that runs suitable software, or a combination of hardware and software elements.

The configuration of FIG. 1 is an exemplary configuration, which is shown purely for the sake of conceptual clarity. Any other suitable SSD or other memory system configuration can also be used. Elements that are not necessary for understanding the principles of the present disclosure, such as various interfaces, addressing circuits, timing and sequencing circuits and debugging circuits, have been omitted from the figure for clarity. In some applications, e.g., non-SSD applications, the functions of SSD controller 30 are carried out by a suitable memory controller.

In the exemplary system configuration shown in FIG. 1, memory devices 34 and SSD controller 30 are implemented as separate Integrated Circuits (ICs). In alternative embodiments, however, the memory devices and the SSD controller may be integrated on separate semiconductor dies in a single Multi-Chip Package (MCP) or System on Chip (SoC), and may be interconnected by an internal bus. Further alternatively, some or all of the SSD controller circuitry may reside on the same die on which one or more of memory devices 34 are disposed. Further alternatively, some or all of the functionality of SSD controller 30 can be implemented in software and carried out by CPU 26 or other processor in the computer. In some embodiments, CPU 26 and SSD controller 30 may be fabricated on the same die, or on separate dies in the same device package.

In some embodiments, processor 42 and/or CPU 26 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

Recovering Original Data Page Upon Programming Failure

We now describe techniques for recovering the original data to be used in re-programming upon programming failure, in accordance with embodiments of. When programming an LSB page, Flash memory cells are programmed to assume one of two predefined programming levels. The page data bits are first cached in page buffer 74. In an example embodiment, erased cells assume a negative erasure programming level (negative threshold voltage) and store a "1" bit value. Cells that store a "0" bit value are programmed to assume a positive programming level (positive threshold voltage).

Programming is typically performed by R/W unit 70, by applying programming (or erasure) pulses to the Flash memory cells. After applying a programming pulse (or possibly multiple pulses) the R/W unit identifies cells that already assume the desired level and replaces their respective bit value in the page buffer to "1" to indicate successful programming and to prevent applying further programming.

Thus, when the programming of the full page succeeds, all the bits in the page buffer are set to "1". On the other hand, when programming of the page fails, "0" bits in the page buffer correspond to cells that are not yet programmed or to cells whose programming has failed (e.g., did not reach the programming level). Thus, "1" bits in the page buffer indicate successful programming (or cells in the erasure state) and therefore the original bits may be recovered from the respective Flash memory cells, whereas "0" bits indicate that the original bits can be recovered from the page buffer.

In some embodiments, following failure in programming a LSB page, system 20 recovers the original page data by retrieving the (partially over-written) bit values from page buffer 74, retrieving the (partially erroneous) bit values from the Flash memory, and combining them to produce a combined page. For each bit in the combined page, system 20 chooses whether to take the corresponding bit value from the page buffer or from the Flash memory. In addition, system 20 assigns each bit value in the combined page a respective reliability metric, depending on whether it was taken from the page buffer or from the Flash memory. ECC unit 54 then decodes the combined page using the reliability metrics assigned to the various bits.

The reliability metrics may depend, for example, on the error correcting code used, and/or on the structure of ECC unit 54. In some embodiments, ECC unit 54 employs a LDPC or RS code, which may use soft Log-Likelihood Ratio (LLR) metrics for the reliability metrics. In such embodiments, an extreme soft value may be assigned as the high reliability metric and lower soft values may be assigned as the reduced reliability metrics. In alternative embodiments (e.g., when ECC unit 54 employs other error correcting codes), binary hard metrics that indicate high and reduced reliability levels may be used. The decision whether to use hard or soft decoding may depend, for example, on the age of the memory device relative to its expected total lifetime, or on the accumulated number of erasure and programming cycles the device has gone through. Alternatively, any other suitable method for deciding whether to use hard or soft ECC decoding can be used.

Table 1 summarizes the recovery rules for reconstructing a LSB page, in accordance with an embodiment. Table 1 also shows the reliability levels assigned to the bits of the combined page.

TABLE 1 bit recovery rules for LSB page

| Bit value in page buffer | Bit value read from Flash memory cell | Source of reconstructed bit | Reconstructed bit | Reliability metric level |
|---|---|---|---|---|
| "1" | "1" | Flash memory cell | "1" | Reduced |
| "1" | "0" | Flash memory cell | "0" | Reduced |
| "0" | "x" ("don't care") | Page buffer | "0" | High |

The method described above for recovering an LSB page can be extended to recovering an MSB page (or similarly higher significance bit pages). For programming an MSB page, page buffer 74 stores both the MSB and the LSB pages. In an embodiment, prior to programming the MSB page to a group of cells the R/W unit reads the respective (successfully previously written) LSB page from the group of cells and stores both the LSB and the MSB pages in the page buffer. While programming memory cells to a certain programming level, cells that have already reached the desired level are marked in the page buffer as successfully programmed by replacing the original data with a success indication data. In some embodiments, the success indication data equals the bits of the erasure state or level, e.g., "11".

The rules for reconstructing the original MSB and LSB bit pair along with respective reliability metrics are summarized in Table 2. The rules state that for locations of the page buffer written with "11", the original bit pair is taken from the respective Flash memory cells. For locations written with data other than "11", the bit pair is taken from the page buffer.

TABLE 2 bit recovery rules for MSB page

| Bit pair value in page buffer | Bit pair value read from Flash memory cell | Source of reconstructed bit pair | Reconstructed bit pair | Reliability metric level |
|---|---|---|---|---|
| "11" | "11" | Flash memory cell | "11" | Reduced |
| "11" | "10" | Flash memory | "10" | Reduced |

TABLE 2-continued bit recovery rules for MSB page

| Bit pair value in page buffer | Bit pair value read from Flash memory cell | Source of reconstructed bit pair | Reconstructed bit pair | Reliability metric level |
|---|---|---|---|---|
| "11" | "00" | Flash memory cell | "00" | Reduced |
| "11" | "01" | Flash memory cell | "01" | Reduced |
| "10" | "xx" ("don't care") | Page buffer | "10" | High |
| "00" | "xx" | Page buffer | "00" | High |
| "01" | "xx" | Page buffer | "01" | High |

The original data page that is reconstructed using Table 1 or 2, combines data retrieved from both the page buffer and the Flash memory cells and is also referred to as a combined data page. The combined page and the reliability metrics are delivered to ECC decoding unit 54 to correct any read errors that may result from reading the Flash memory cells.

When reconstructing data from the Flash memory cells, SSD controller 30 can use default read thresholds, i.e., the same read thresholds used for normal read operations. In alternative embodiments, however, the SSD controller can use any other suitable read thresholds, e.g., a different set of read thresholds used for recovery.

In some embodiments, reconstructing the combined page using Table 1 and/or 2 is performed by R/W unit 70. The combined page is than delivered to SSD controller 30 to recover the data page by performing ECC decoding using ECC unit 54. SSD controller 30 can re-program the recovered page or alternatively send the recovered page to host 26 to manage re-programming. In yet alternative embodiments, the generation of the combined page can be performed by the SSD controller instead of R/W unit 70. Further alternatively, the disclosed technique can be carried out with any other suitable division of labor between R/W unit 70, SSD controller 30 and/or host 26. The element or elements carrying out the disclosed technique are thus collectively referred to herein as "storage circuitry."

Figure 2:
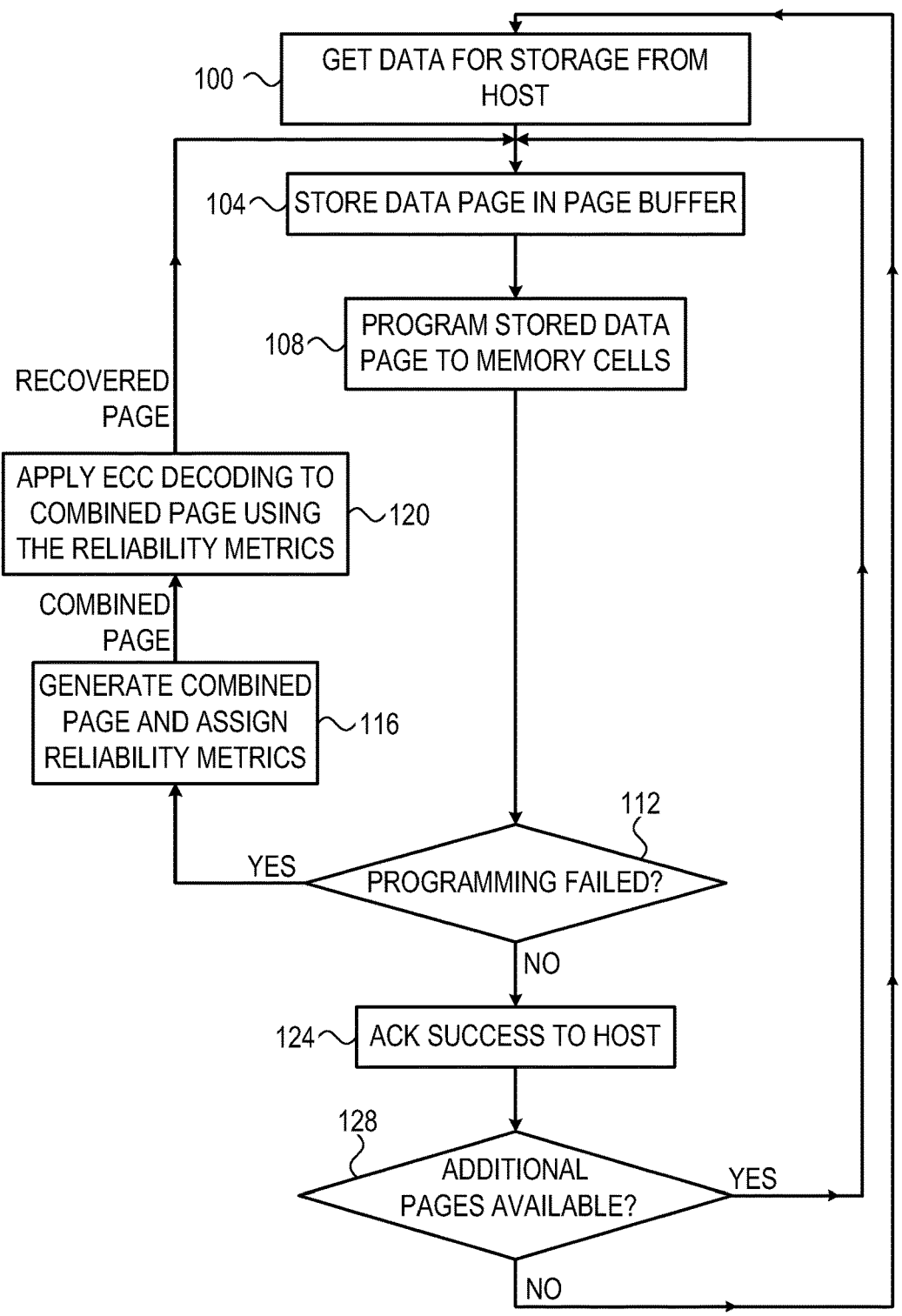
FIG. 2 is a flow chart that schematically illustrates a method for programming a non-volatile memory, in accordance with an embodiment.

FIG. 2 is a flow chart that schematically illustrates a method for programming a non-volatile memory, in accordance with an embodiment. The method is described as being carried out with a certain division of labor between SSD controller 30 and R/W unit 70. In alternative embodiments, the method can be carried out in any other suitable way, by R/W unit 70, SSD controller 30, or by both SSD controller 30 and R/W unit 70.

The method begins with SSD controller 30 accepting data for storage from host 26, at an accepting host data step 100. SSD controller 30 stores a data page unit out of the host data in page buffer 74, at a caching step 104. If at step 104 the page is to be written as a MSB page, the R/W unit reads the respective LSB page from the Flash memory cells in order to determine the appropriate programming levels.

At a programming step 108, R/W unit 70 programs the page cached in the page buffer to the Flash memory cells of array 76. The R/W unit may use any suitable programming method for programming the Flash memory cells. For example, R/W unit 70 may apply any suitable Programming and Verification (P&V) process to the Flash memory cells until they reach the desired programming levels. While programming, bits in the page buffer that correspond to Flash memory cells that have already reached the desired programming level are set to "1" (or to "11" in MSB page programming) to indicate that the cells are successfully programmed and should not be subjected to additional programming pulses.

At a failure testing step 112, R/W unit 70 checks whether the programming of the data page has failed. In an embodiment, the R/W unit identifies cells whose programming has failed by identifying locations in the page buffer in which data other than the success indication is written. In alternative embodiments, R/W unit 70 can use any other suitable method for recognizing programming failure.

If at step 112 the R/W unit concludes that the programming is successful, the SSD controller sends a success acknowledgement message to host 26, at an acknowledgment step 124. At a page availability checking step 128, SSD controller 30 checks whether there are any additional data pages to be programmed. If at step 128 SSD controller 30 finds that there is at least one additional page to program, the method loops back to step 104 to store the next page to be programmed in page buffer 74. Otherwise, the method loops back to step 100 to accept subsequent data from host 26.

If at step 112 above, the R/W unit detects that the programming of the data page has failed, the SSD controller recovers the original page data at steps 116 and 120, as described below, and loops back to step 104 to re-program the recovered page. In some embodiments, the SSD controller programs the recovered page in a block or word line other than the block or word line in which the programming has failed. In alternative embodiments, however, the SSD controller may erase the block in which programming failure has occurred and re-program the block with the recovered data (and possibly other data).

Figure 3:
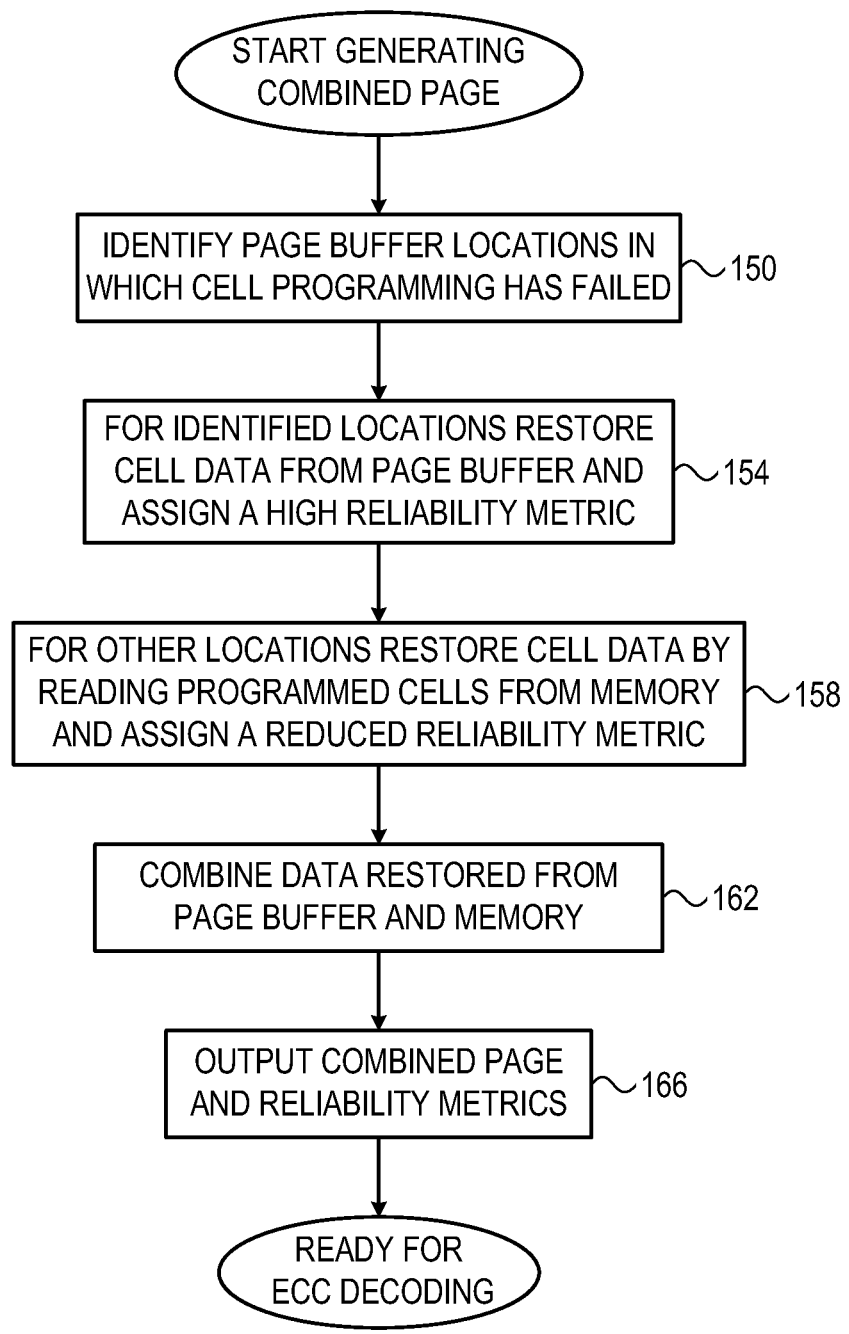
FIG. 3 is a flow chart that schematically illustrates a method for recovering from a programming failure, in accordance with an embodiment.

As described above, page recovery after programming failure is performed at steps 116 and 120. At a combined page generation step 116, the SSD controller combines data read from the page buffer 74 and from respective Flash memory cells in array 76 to generate a combined data page. For example, SSD controller 30 can use the recovery rules depicted in Table 1 and 2 above. While reconstructing the original data page, data reconstructed from the page buffer is assigned with high reliability metrics and data reconstructed from the memory is assigned reduced reliability metrics. FIG. 3 below details an example method for the implementation of step 116.

SSD controller 30 uses the combined page and the assigned reliability metrics to derive the recovered page, at a page recovery step 120. The SSD controller applies ECC decoding to the combined page using the reliability metrics to derive an error-free recovered page which is re-programmed at step 104 as explained above.

FIG. 3 is a flow chart that schematically illustrates a method for recovering from a programming failure, in accordance with an embodiment. The method of FIG. 3 can be used, for example, in the method of FIG. 2 as a detailed implementation of step 116. The method starts with R/W unit 70 identifying locations in the page buffer in which programming has failed, at a failed cells identification step 150. The identification of cells whose programming has failed can be performed by identifying locations in the page buffer in which data other than the success indication is written.

For the locations identified at step 150, R/W unit 70 restores the original data by reading the corresponding bit values from page buffer 74, at a restoring from page buffer step 154, and assigns the restored data bits high reliability metrics. At a restoring from memory step 158, SSD controller 30 restores the original data, for locations in the page buffer that were not identified at step 150, by reading the corresponding bit values from the Flash memory cells of array 76, and assigns the restored data bits reduced reliability metrics. At steps 154 and 158, R/W unit 70 can use the rules defined in Table 1 and 2 above to identify cells that has passed or failed the programming.

At a combination step 162, the R/W unit combines the data restored at steps 154 and 158 to generate a combined page. In an embodiment, the combined page is stored in-place in page buffer 74. The combined page and the respective assigned reliability metrics are output at an outputting step 166, e.g., made accessible to the SSD controller, and the method then terminates.

The methods described above are exemplary methods, and other methods can be used in alternative embodiments. For example, instead of identifying cells whose programming has succeeded or failed using a success indication written in the page buffer, the SSD controller can directly read programmed levels of the cells and identify cells that did not reach either of the desired programming levels. Alternatively, The SSD controller can store the success indications in a memory other than the page buffer.

As another example, when programming an MSB page, instead of setting a two bit (e.g., "11") to indicate programming success, the R/W unit or the SSD controller can use a single "1" bit similarly to programming a LSB page, and thus maintaining the original LSB page in the page buffer.

In some embodiments, all the data bits retrieved from the Flash memory to generate the combined data page are assigned the same value of reduced reliability metric. In alternative embodiments, different values of reduced reliability metric can be assigned to different bits retrieved from the Flash memory cells. In an example embodiment, a first read operation assigns equal metrics to all the bits read from memory array 76. If ECC decoding of the combined page (that was created using these bits) fails, one or more additional read operations are performed (possibly with different read thresholds) to create soft reliability metrics that may differ among the read bits. Then soft ECC decoding is applied using the read bits and the soft metrics.

In embodiments in which ECC unit 54 resides in the SSD controller, data (e.g., bits read from array 76 or a combined page if combining is carried out in R/W unit 70 of the Flash device) is transferred via memory interface 46 to the SSD controller. The data is then subjected to ECC decoding by ECC unit 54 and sent back via the memory interface to the Flash device for reprogramming. Thus, in such embodiments, upon each programming failure the memory interface is typically used once in each direction.

In alternative embodiments, ECC unit 54 is implemented in FLASH device 34. In such embodiments, upon programming failure the Flash device signals the event to the SSD controller, e.g., using the status register. In response, the SSD controller sends to the Flash device via memory interface 46 a programming command that includes an alternative Flash address (but without the data). The Flash device internally recovers the failing page (including ECC decoding) and reprograms the recovered page to the alternative address. Assuming that signaling of a programming failure to the SSD controller is fast and efficient, usage of the memory interface is required in only one direction.

It will be appreciated that the embodiments described above are cited by way of example, and that the present disclosure is not limited to what has been particularly shown and described hereinabove. Rather, the scope of the disclosure includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus, comprising:
a buffer memory;
a plurality of memory devices; and
a controller configured to:
receive a page of data for storage;
store the page of data in the buffer memory to generate a buffered data page;
program the page of data in at least one memory device of the plurality of memory devices;
store, based on successful programming of a given data bit included in the page of data, a particular logic value in a respective data bit of a plurality of data bits in the buffer memory;
check the buffer memory to determine if programming the page of data was successful;
retrieve previously programmed data from the at least one memory device in response to a determination that programming the page of data was unsuccessful;
combine the previously programmed data with the buffered data page to generate a combined page;
decode an Error Correction Code (ECC) associated with the combined page to generate a recovered page; and
program the recovered page in the at least one memory device.

2. The apparatus of claim 1, wherein to combine the previously programmed data with the buffered data page, the controller is further configured to assign a respective reliability metric to each data bit of the combined page.

3. The apparatus of claim 2, wherein to assign a respective reliability metric to each data bit of the combined page, the controller is further configured to assign a high reliability metric to a given bit in response to a determination the given bit was retrieved from the buffered data page and that the page of data corresponds to a Least-Significant-Bit (LSB) page.

4. The apparatus of claim 2, wherein to assign a respective reliability metric to each data bit of the combined page, the controller is further configured to assign a high reliability metric to a given bit pair in response to a determination the given bit pair was retrieved from the buffered data page and that the page of data corresponds to a Most-Significant-Bit (MSB) page.

5. The apparatus of claim 1, wherein the particular logic value comprises a logic 1value.

6. The apparatus of claim 1, wherein each memory device of the plurality of memory devices includes a non-volatile memory.

7. A method, comprising:
receiving a page of data for storage;
storing the page of data in a buffer memory to generate a buffered data page;
programming the page of data in at least one memory device of a plurality of memory devices;

storing, based on successful programming of a given data bit included in the page of data, a particular logic value in a respective data bit of a plurality of data bits in the buffer memory;

checking the buffer memory to determine if programming the page of data was successful;

retrieving previously programmed data from the at least one memory device in response to a determination that programming the page of data was unsuccessful;

combining the previously programmed data with the buffered data page to generate a combined page;

decoding an Error Correction Code (ECC) associated with the combined page to generate a recovered page; and programming the recovered page in the at least one memory device.

8. The method of claim 7, wherein combining the previously programmed data with the buffered data page comprises assigning a respective reliability metric to each data bit of the combined page.

9. The method of claim 8, wherein assigning a respective reliability metric to each data bit of the combined page comprises assigning a high reliability metric to a given bit in response to determining the given bit was retrieved from the buffered data page and that the page of data corresponds to a Least-Significant-Bit (LSB) page.

10. The method of claim 8, wherein assigning a respective reliability metric to each data bit of the combined page comprises assigning a high reliability metric to a given bit pair in response to determining the given bit pair was retrieved from the buffered data page and that the page of data corresponds to a Most-Significant-Bit (MSB) page.

11. The method of claim 8, wherein the respective reliability metric includes a Log-Likelihood Ratio (LLR).

12. The method of claim 7, wherein the particular logic value comprises a logic 1 value.

13. The method of claim 7, further comprising sending an acknowledgement message to a host in response to determining the page of data was successfully programmed.

14. A system, comprising:
a host; and
a storage device that includes a buffer memory and a plurality of memory devices,
wherein the storage device is configured to:
receive a page of data for storage from the host;
store the page of data in the buffer memory to generate a buffered data page;
program the page of data in at least one memory device of the plurality of memory devices;
store, based on successful programming of a respective data bit included in the page of data, a particular logic value in a respective data bit of a plurality of data bits in the buffer memory;
check the buffer memory to determine if programming the page of data was successful;
retrieve previously programmed data from the at least one memory device in response to a determination that programming the page of data was unsuccessful;
combine the previously programmed data with the buffered data page to generate a combined page;
decode an Error Correction Code (ECC) associated with the combined page to generate a recovered page; and
program the recovered page in the at least one memory device.

15. The system of claim 14, wherein to combine the previously programmed data with the buffered data page, the storage device is further configured to assign a respective reliability metric to each data bit of the combined page.

16. The system of claim 15, wherein to assign a respective reliability metric to each data bit of the combined page, the storage device is further configured to assign a high reliability metric to a given bit in response to a determination the given bit was retrieved from the buffered data page and that the page of data corresponds to a Least-Significant-Bit (LSB) page.

17. The system of claim 15, wherein to assign a respective reliability metric to each data bit of the combined page, the storage device is further configured to assign a high reliability metric to a given bit pair in response to a determination the given bit pair was retrieved from the buffered data page and that the page of data corresponds to a Most-Significant-Bit (MSB) page.

18. The system of claim 14, wherein the particular logic value comprises a logic 1 value.

19. The system of claim 14, wherein the storage device is further configured to send an acknowledgement message to a host in response to a determination that the page of data was successfully programmed.

20. The system of claim 14, wherein each memory device of the plurality of memory devices includes a non-volatile memory.

* * * * *